United States Patent [19]

Asetta et al.

[11] Patent Number: 5,273,615
[45] Date of Patent: Dec. 28, 1993

[54] APPARATUS AND METHOD FOR HANDLING FRAGILE SEMICONDUCTOR WAFERS

[75] Inventors: Paul D. Asetta, Mesa; Lawrence R. Gardner; Michael P. Norman, both of Chandler, all of Ariz.

[73] Assignee: Motorola, Inc., Schaumburg, Ill.

[21] Appl. No.: 862,892

[22] Filed: Apr. 6, 1992

[51] Int. Cl.$^5$ .................. B32B 31/00; B24B 1/00; B23B 13/00; B25B 11/00

[52] U.S. Cl. ........................ 156/584; 156/381; 156/389; 156/344; 156/305; 156/155; 156/152; 51/235; 29/25.01; 279/3; 269/21

[58] Field of Search ............ 51/235; 29/25.01, 402.03, 29/762, 764, ; 279/3; 269/21; 437/226; 156/155, 152, 305, 391, 344, 381, 389, 584

[56] References Cited

U.S. PATENT DOCUMENTS

| | | | |
|---|---|---|---|
| 3,740,900 | 6/1973 | Youmans | 51/235 |
| 3,847,697 | 11/1974 | Baker | 156/230 X |
| 3,851,758 | 12/1974 | Makhijani | 156/584 X |
| 3,988,196 | 10/1976 | Wanesky | 156/541 |
| 3,989,566 | 11/1976 | Egan | 156/236 X |
| 4,138,304 | 2/1979 | Gantley | 156/268 |
| 4,316,757 | 2/1982 | Walsh | 156/286 |
| 4,466,852 | 8/1984 | Beltz | 156/344 |
| 4,603,867 | 8/1986 | Babb | 279/3 |
| 4,747,608 | 5/1988 | Sato | 279/3 X |
| 5,171,398 | 12/1992 | Miyamoto | 279/3 X |

OTHER PUBLICATIONS

Howell, William C., "The Direct Demount of Thinned GaAs Wafers to Sawing Tape," Proceedings of the Conference on Gallium Arsenide Manufacturing Technology (Mantech), 1990.

Primary Examiner—David A. Simmons
Assistant Examiner—Charles Rainwater
Attorney, Agent, or Firm—Joe E. Barbee; Rennie William Dover

[57] ABSTRACT

An apparatus (60) which handles fragile semiconductor wafers (21) adhesively mounted to a submount (22) using a high temperature wax is provided. The apparatus (60) includes a vacuum chuck (24) for holding a first surface of the wafer (21) and a solvent chamber (11, 11') for applying solvent to the back surface of the submount (22). The apparatus (60) includes an enclosure (29) for providing an inert gas environment around the solvent chamber (11, 11'), the wafer (21), and the vacuum chuck (24). The apparatus (60) further includes a means for remounting (30) the wafer (21) to a submount (22) using a low temperature wax after the high temperature wax is dissolved. The wafer (21) is then released from the vacuum chuck (24) and the first surface of the wafer (21) is mounted to an adhesive tape (34). Following the mounting, the low temperature wax is dissolved or melted to demount the wafer (21) from the submount (22), leaving the wafer (21) securely mounted on the adhesive tape (34) for sawing.

14 Claims, 2 Drawing Sheets

APPARATUS AND METHOD FOR HANDLING FRAGILE SEMICONDUCTOR WAFERS

BACKGROUND OF THE INVENTION

The present invention relates, in general, to semiconductor wafer handling, and more particularly, to an apparatus and method for handling very thin and fragile semiconductor wafers.

An array of semiconductor wafer handling equipment is available and works quite well for a large number of semiconductor processing needs. Increasing circuit density increases heat generated by the circuit. To remove this heat from integrated circuits manufacturers use thinner and thinner semiconductor wafers. These thinner wafers break easily, and thus demand more from semiconductor wafer handling equipment. This problem is more acute in the case of compound semiconductors, particularly gallium arsenide (GaAs) which is a factor of two and a half times as brittle as silicon.

Because devices manufactured on GaAs wafers typically operate at high frequencies, flatness and thickness uniformity become more important determinants of electrical performance than is true in silicon devices. Much of the special equipment needed for handling thinned GaAs wafers never had to be developed for silicon manufacturing. Handling of thinned GaAs wafers currently involves a large amount of manual handling, including moving the wafers by sliding them from one flat surface to another. Moreover, manual handling requires special skill and still results in unacceptable damage to the wafers.

Semiconductor wafers can be adhesively mounted on a submount or "handle" which provides a rigid platform to support the fragile wafer and allow automated handling. One problem with submounting, however, is that the wafer must at some point be removed from the submount. In the past, waxes have been used as an adhesive. These waxes had to have a low melting temperature, however, to allow the wax to be melted to remove the wafer from the submount, and to ensure that the wax could be cleaned from the wafer surface. An example of such a process is described in an article entitled "The Direct Demount of Thinned GaAs Wafers to Sawing Tape" by William C. Howell, published in the Proceedings of the Conference on Gallium Arsenide MANufacturing TECHnology (MANTECH), 1990. One problem with low temperature waxes is that they break down, melt, or dissolve during conventional wafer processing such as grinding the back side of the wafers. Alternatively, adhesive tape is used to mount the wafers to the submount. Adhesive tape, however, is difficult to work with, relatively expensive, can distort the shape of the thinned wafer, and results in an unacceptable number of broken wafers if automated taping equipment is used.

What is needed is an apparatus and method for handling fragile semiconductor devices in an automated fashion with minimal wafer breakage.

SUMMARY OF THE INVENTION

Briefly stated, the present invention is achieved by an apparatus which handles fragile semiconductor wafers adhesively mounted to a submount using a high temperature wax. The submount has a plurality of holes formed therein allowing liquid to pass from the back surface of the submount to the wax. The apparatus includes a vacuum chuck for holding a back surface of the wafer and a solvent chamber for applying solvent through the back surface of the submount. An annular seal of the solvent chamber prevents solvent from reaching the wafer and vacuum chuck directly.

In another embodiment, the apparatus includes an enclosure for providing an inert gas environment around the solvent chamber, wafer, and vacuum chuck. The apparatus further includes a means for remounting the wafer to a submount using low temperature wax after the high temperature wax is removed from the front side of the wafer. The wafer is then released from the vacuum chuck and the back surface of the wafer is mounted to an adhesive dicing tape. Following the mounting, the low temperature wax is dissolved or melted to demount the wafer from the submount, leaving the wafer securely mounted on the dicing tape for sawing.

As used herein, the term "high temperature wax" is used to mean a wax having a melting point above approximately 140° C., and the term "low temperature wax" is used to mean a wax having a melting point below approximately 90° C.

DETAILED DESCRIPTION OF THE DRAWINGS

Figure 1:
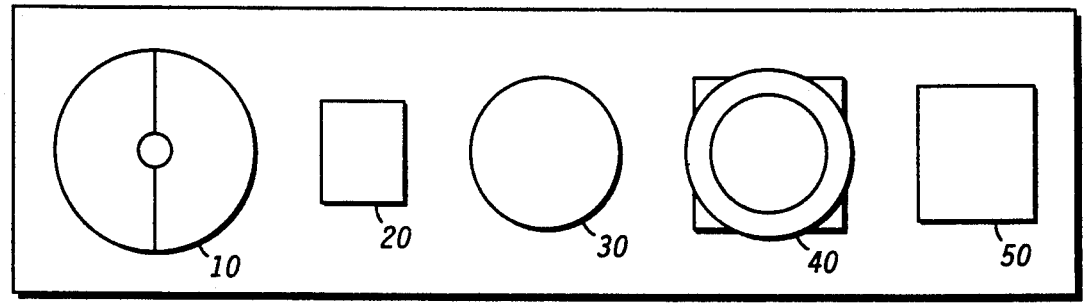
FIG. 1 is a highly simplified layout of a wafer handling apparatus in accordance with the present invention.

FIG. 1 illustrates a highly simplified layout of a wafer handler in accordance with the present invention. While the present invention is illustrated as an assembly line, it should be understood that some of the discrete process steps shown in FIG. 1 can be integrated to reduce the total number of processing stations in the apparatus. For ease of understanding, however, each process step is illustrated as performed at a unique processing station. Also, the processing stations may be arranged in a linear, circular, or other arrangement to fit particular needs of a manufacturing environment.

The present invention is particularly useful for handling semiconductor wafers which are thinned by grinding and polishing a back side of the wafer. Prior to the thinning steps, the wafers are mounted to a rigid submount using adhesive wax. As will be seen, any adhesive which can be dissolved in solvent and which provides adequate adhesion is acceptable for purposes of the present invention. Although useful for many wafer handling operations, the present invention will be described with reference to a difficult handling process required to transfer the wafers from the submount to an adhesive dicing tape. Adhesive dicing tape is commonly used to support thinned wafers during sawing.

Details of each element of handler 60 shown in FIG. 1 are illustrated and described in greater detail in reference to the other drawings. FIG. 1 provides a general overview of the function and interaction of the component elements of apparatus 60. Apparatus 60 includes a solvent demounting station 10. Demounting station 10 is used to dissolve a high temperature wax adhesive and to transfer a semiconductor wafer from a submount to a vacuum chuck. Once the wafer is securely grasped by the vacuum chuck a solvent clean processing station 20 completes removal of the high temperature adhesive wax. Solvent clean station 20 is not needed if wafers leaving demounting station 10 are free of adhesive wax.

Soft remount station 30 serves to remount the wafer to the submount using a low temperature water soluble wax, or other low temperature water soluble adhesive. Unlike high temperature adhesives, the low temperature adhesive can be removed by processes compatible with the adhesive tape used in saw tape applicator station 40. As set out in the background, low temperature adhesive wax, while compatible with the saw tape applicator operation, is inadequate for grinding and back metal sputtering operations, which require an adhesive that can withstand high temperatures.

The wafer is mounted to adhesive saw tape in the saw tape applicator and demount station 40. Demount station 40 also dissolves the low temperature adhesive wax with a warm water solution, so that the wafer remains supported by the saw tape. A water clean station 50 is also included, but is not needed if the low temperature adhesive wax is cleaned from the wafer during the demount operation. Once mounted on saw tape, the wafer is ready for further assembly processing.

Figure 2:
FIG. 2 is a cross-sectional view of a solvent demounting station of the apparatus shown in FIG. 1.
Figure 2:
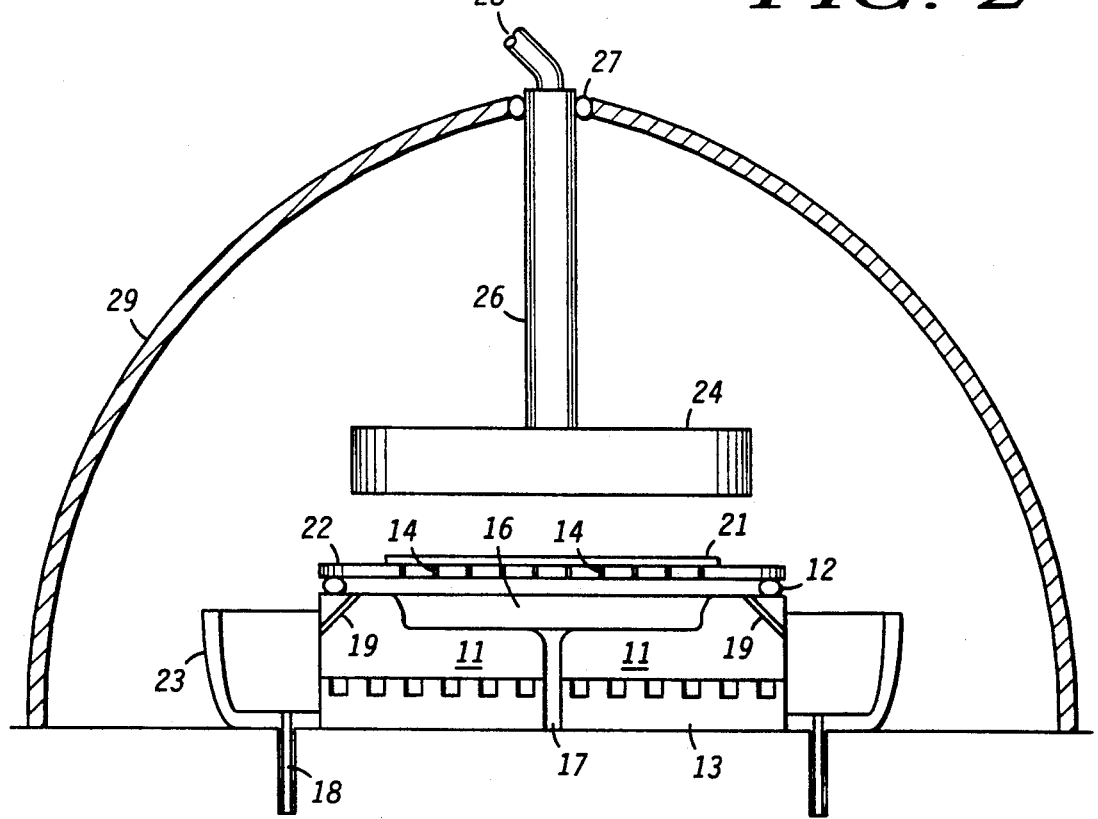

FIG. 2 illustrates a portion of solvent demounting station 10 shown in FIG. 1. Wafer 21 has a front side or first surface having a plurality of semiconductor devices formed therein. The front side of wafer 21 is mounted on submount 22 using an adhesive wax prior to processing on the apparatus shown in FIG. 1. Wafer 21 may be thinned by grinding and polishing a back surface of wafer 21, and metallization may be applied to the back surface of wafer 21 before processing on the apparatus shown in FIG. 1.

Submount 22 includes a plurality of holes 14 which allow solvent to pass from a bottom or back surface of submount 22 to a top or front surface of submount 22. In a preferred embodiment submount 22 comprises a material having a similar thermal expansion coefficient as wafer 21 and has several hundred small holes 14 machined through it. Because the adhesive wax (not shown) lies between wafer 21 and submount 22, the wax is exposed to liquid flowing in holes 14.

Mounting the semiconductor wafer to the submount is achieved by coating the top surface of the wafer with an adhesive wax. The adhesive wax is uniformly applied by spin coating, but other coating processes are known. The wax coated wafer is then placed front side down on the submount. The wafer and submount are heated to melt the wax, and cooled to solidify the wax, thereby bonding the wafer to the submount. The mounting, polishing, and metallization processes involve techniques that are known in the semiconductor arts. For example, a method of wax mounting wafers is described in U.S. Pat. No. 4,316,757 issued to R. Walsh on Feb. 23, 1982, and incorporated herein by reference.

Solvent chamber 11 comprises a solvent resistant material such as stainless steel. Chamber 11 is machined to provide a cavity 16 for holding solvent. An annular portion of chamber 11 surrounds cavity 16 and provides a flat surface for seal 12. Seal 12 conveniently comprises a solvent resistant O-ring or the like. Seal 12 is shaped to provide a solvent-tight seal against the back surface of submount 22 such that holes 14 are over cavity 16 of solvent chamber 11. Submount 22 is pressed against seal 12 to direct solvent through holes 14.

Solvent chamber 11 is preferably heat resistant and thermally conductive so that disk heater 13 may be positioned on and thermally coupled to a bottom surface of solvent chamber 11 to heat solvent in cavity 16. In a preferred embodiment, solvent is also heated prior to entering cavity 16, and heater 13 is used to maintain the solvent temperature. Inlet 17 allows cavity 16 to be filled with solvent. During operation, the adhesive wax between wafer 21 and submount 22 is dissolved and solvent flows through holes 14, across a top surface of submount 22 and to a solvent drain 18 located outside of solvent chamber 11.

The high temperature solvent, operating at 170° C., for example, is very strong, thereby reducing the time required to dissolve the high temperature wax. The heat melts the high temperature wax, allowing it to flow. Because the wax is flowing, the solvent dissolves the wax rapidly and uniformly allowing wafer 21 to release from submount 22 quickly without undue stress. The combination of high temperature to melt the wax and a solvent to dissolve the wax is a key feature of this embodiment of the present invention. This feature of the present invention reduces the time required to separate wafer 21 from submount 22 to less than a minute in most applications.

Preferably, the solvent is recirculated in a closed-loop system, with additional solvent added at a rate determined by process experience. In some applications it may be desirable to circulate solvent in cavity 16 during operation to speed dissolution of the adhesive wax between wafer 21 and submount 22. Circulation can be achieved by placing solvent outlets 19 in chamber 11 to allow solvent to flow and circulate before the adhesive wax begins to dissolve. Alternatively, magnetic or mechanical stirring tools or other known circulation methods can be used inside solvent cavity 16. A solvent well 23 surrounds solvent chamber 11 to capture solvent as it leaves chamber 11 and direct the solvent towards solvent drain 18.

The back surface of wafer 21 is grasped by vacuum chuck 24, while the front surface remains adhesively attached to submount 22. A robot arm or handle 26 is attached to chuck 24. A portion of handle 26 extends outside of enclosure 29, allowing some movement of chuck 24 during operation. A vacuum line 28 runs through a central portion of handle 26 and supplies the vacuum used by chuck 24 to grasp wafer 21.

In operation, wafer 21 is secured by vacuum chuck 24 as solvent is applied to the adhesive wax. As wafer 21 detaches from submount 22 it remains supported by vacuum chuck 24 and wafer damage is avoided. Chuck 24 can be weighted so that wafer 21 remains in the flowing solvent after wafer 21 has detached from submount 22, allowing the solvent to clean additional adhesive wax from wafer 21. Also, this cleaning operation can be performed in a similar manner at solvent cleaning station 20 shown in FIG. 1. Cleaning station 20 may use a room temperature solvent, for example, so that residual high temperature wax is removed from wafer 21 in a few minutes. The construction and operation of solvent cleaning station 20 are well understood in the art, and are not described in greater detail here.

In a preferred embodiment an enclosure 29 surrounds chuck 24, wafer 21, submount 22 as well as solvent chamber 11 and other components shown in FIG. 2. A seal 27 is positioned between enclosure 29 and handle 26. Enclosure 29 is filled with an inert gas, such as dry nitrogen, to prevent ignition of solvent fumes. This allows the solvent to be heated beyond its flash point in oxygen or air. Also, because hot solvent is used, high temperature wax, such as glycol phthalate, can be used to bond wafer 21 to submount 22. High temperature wax is more durable and has resistance to many semiconductor processes, thus increasing the number and variety of processes which can be performed while wafer 21 is mounted to submount 22. For example, grinding, polishing, and metal depositions can be performed even though wafer 21 is quite fragile. Enclosure 29 is only one example of a safety feature which may improve performance of the present invention, and other known safety techniques for dealing with hot solvent vapors may also be used.

Figure 3:
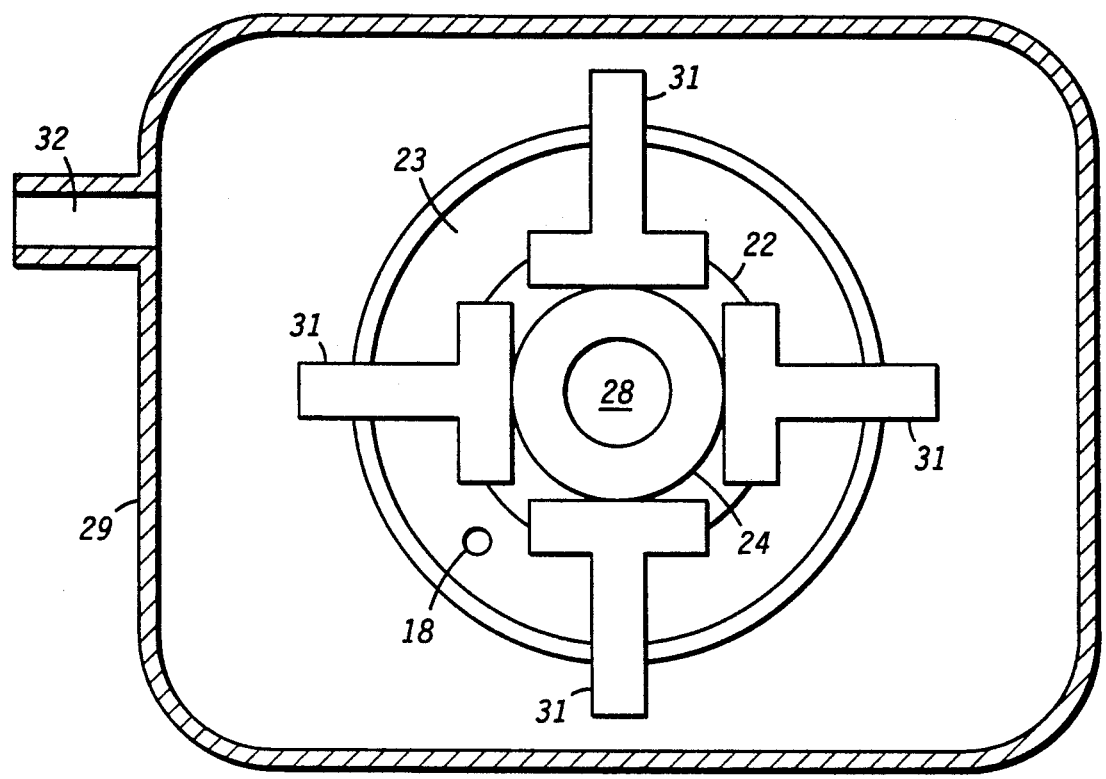
FIG. 3 is a top-view of the solvent demounting station shown in FIG. 2.

FIG. 3 illustrates a top view of the solvent demounting station 10 shown in FIG. 2. Handle 26 extends upward from a central portion of chuck 24. Chuck 24 hides wafer 21 in FIG. 3. A portion of submount 22 extends beyond chuck 24 so that submount pinning arms 31 can apply downward pressure on submount 22. Pressure applied by submount pinning arms 31 ensures that submount 22 seals against seal 12 shown in FIG. 2. Solvent well 23 and solvent drain 18 are positioned as described hereinbefore. Enclosure 29 can be any convenient shape, and preferably includes an exhaust 32 to prevent buildup of solvent fumes inside chamber 29.

Once wafer 21 is separated from submount 22 and cleaned, it is remounted onto submount 22 using a low temperature wax at soft remount station 30 shown in FIG. 1. Wafer 21 is transported either by hand or using a mechanical transport system. Remounting involves coating the front side of wafer 21 with a low temperature wax such as LV-30 manufactured by Speedfam. Preferably, the wax is liquified in a solvent such as acetone and applied to the wafer by spin coating. The remount process of the present invention does not require a high degree of wax flatness or uniformity, but these features are desirable. Remounting is accomplished by melting the low temperature wax and pressing wafer 21 into the surface of submount 22. Submount 22 is then cooled to solidify the wax.

A great deal of design latitude is permissible for remount station 30 using well known technology, and so construction and operation will not be discussed in greater detail here. Soft remount station 30 can be constructed simply by providing a hot plate or disk heater on which the remount operation takes place. An example of a method and apparatus for wax mounting of thin wafers is shown in U.S. Pat. No. 4,316,757 issued to Robert J. Walsh on Feb. 23, 1982.

Figure 4:
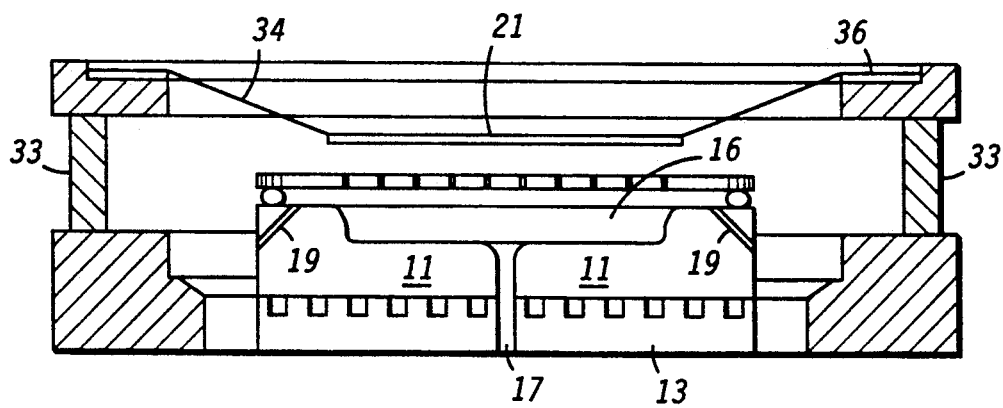
FIG. 4 is a cross-section of a tape applicator demounter station.

Once wafer 21 is remounted to submount 22 using low temperature wax, wafer 21 is released from vacuum chuck 24 and the wafer-submount assembly can be transferred to tape applicator and demount station 40. Transfer can be accomplished by hand or by well known transport mechanisms such as belts, cables, an arm, or the like. A cross-sectional view of the tape applicator and demount station 40 is shown in FIG. 4. The demount portion of tape applicator and demount station 40 is substantially the same as solvent demounting station 10 in construction and operation. Because demount station 40 uses only water or mild solvents and operates at lower temperatures than solvent demounting station 10, material requirements are less stringent and an enclosure similar to enclosure 29 shown in FIG. 3 is not needed. Portions of demount station 40 which operate in a similar manner to solvent demounting station 10 are designated with the same reference numeral as used in FIG. 2 but bear a prime designation in FIG. 4.

Tape applicator and demount station 40 also includes a tape frame holder 33 which is constructed of a rigid material such as stainless steel and is shaped to hold tape frame 36. Tape frame 36 is usually constructed of plastic or stainless steel and is shaped to fit into a groove machined in the surface of tape frame holder 33. An area of adhesive mounting tape 34, also called saw tape, is stretched onto tape frame 36 as is conventionally done in semiconductor device manufacturing. The exposed surface of wafer 21 is attached to tape 34. Submount 22 is clamped to the annular portion of chamber 11'.

In a preferred embodiment, cavity 16' is filled with warm deionized water through inlet 17'. The water is kept warm by heat from disk heater 13'. The water melts and dissolves the low temperature wax through holes 14 in submount 22. Once all of the low temperature wax is dissolved, wafer 21 is released from submount 22 and supported by tape 34. Tape frame 36 is then removed from tape frame holder 33, and tape frame 36, tape 34, and wafer 21 are transported to subsequent operations, such as cleaning or sawing.

The front side of wafer 21 may be cleaned with warm water to remove the residual low temperature wax in water clean station 50 shown in FIG. 1. Water clean station 50 comprises, for example, a commercially available scrubber with an infrared heater. It may also be desirable to coat wafer 21 with photoresist or a similar coating to protect circuits formed on wafer 21 from damage during the saw operation. Such a coating can be applied by spin coating the entire frame, tape, and wafer assembly.

By now it should be appreciated that an apparatus and method for handling fragile semiconductor wafers is provided. Further, the apparatus in accordance with the present invention allows the use of process resistant high temperature waxes and improves throughput by decreasing the time required to separate semiconductor wafers from submounts or handle wafers. The method of handling fragile wafers in accordance with the present invention provides reduced breakage, minimal wafer damage, and a high degree of automated handling.

We claim:

1. An apparatus for handling a fragile semiconductor wafer comprising: a rigid submount having a front surface and a back surface opposite the front surface, wherein the semiconductor wafer has a first surface mounted to the front surface of the rigid submount by a high temperature adhesive, the wafer has a second surface which is exposed, and the rigid submount has a plurality of holes formed therein allowing liquid to pass from the back surface to the front surface; a vacuum chuck for holding the second surface of the wafer; a solvent chamber including a cavity for holding a pool of solvent, an annular portion surrounding the cavity, and an inlet coupled to the cavity for filling the cavity with solvent; and an annular seal on the annular portion of the solvent chamber, wherein the annular seal is shaped to provide a solvent-tight seal against the back surface of the rigid submount such that the plurality of holes in the rigid submount are over the cavity of the solvent chamber.

2. The apparatus of claim 1, further comprising means for circulating the solvent in the cavity of the solvent chamber.

3. The apparatus of claim 1 further comprising an enclosure surrounding the vacuum chuck, the solvent chamber, and the rigid submount, wherein the enclosure is filled with an inert gas.

4. The apparatus of claim 3 wherein the inert gas is nitrogen.

5. The apparatus of claim 1 further comprising a heater thermally coupled to the solvent chamber for heating the pool of solvent.

6. The apparatus of claim 1, further comprising means for clamping the rigid submount against the annular seal.

7. An apparatus for handling a fragile semiconductor wafer, comprising:
- a rigid submount having a front surface and a back surface opposite the front surface, wherein the semiconductor wafer has a first surface mounted to the front surface of the rigid submount by a high temperature adhesive, the wafer has a second surface which is exposed, and the rigid submount has a plurality of holes formed therein allowing liquid to pass from the back surface to the front surface;
- a vacuum chuck for holding the second surface of the wafer;
- a solvent chamber including a cavity for holding a pool of solvent, an annular portion surrounding the cavity, and an inlet coupled to the cavity for filling the cavity with solvent;
- an annular seal on the annular portion of the solvent chamber, wherein the annular seal is shaped to provide a solvent-tight seal against the back surface of the rigid submount such that the plurality of holes in the rigid submount are over the cavity of the solvent chamber;
- means for clamping the rigid submount against the annular seal;
- means for remounting the wafer onto the rigid submount using a low temperature adhesive wax;
- means for removing the remounted wafer from the vacuum chuck; and
- means for attaching the second surface of the remounted wafer onto an adhesive tape.

8. The apparatus of claim 7 further comprising a means for dissolving the low temperature wax to separate the wafer from the submount.

9. The apparatus of claim 7 wherein the high temperature wax comprises glycol phthalate.

10. The apparatus of claim 7, further including means for circulating the solvent in the cavity of the solvent chamber.

11. The apparatus of claim 10, wherein the means for circulating the solvent in the cavity of the solvent chamber comprises a solvent outlet extending from the annular portion of the solvent chamber to a solvent well surrounding the solvent chamber.

12. The apparatus of claim 7, further comprising an enclosure surrounding the vacuum chuck, the solvent chamber, and the rigid submount, wherein the enclosure is filled with an inert gas.

13. The apparatus of claim 12, wherein the inert gas is nitrogen.

14. The apparatus of claim 7, further comprising a heater thermally coupled to the solvent chamber for heating the pool of solvent.

* * * * *